(12) United States Patent
Morimoto et al.

(10) Patent No.: US 8,571,284 B2
(45) Date of Patent: Oct. 29, 2013

(54) SURFACE ANALYZER

(75) Inventors: Takashi Morimoto, Kyoto (JP); Akinori Kogure, Hadano (JP)

(73) Assignee: Shimadzu Corporation, Kyoto (JP)

( * ) Notice: Subject to any disclaimer, the term of this patent is extended or adjusted under 35 U.S.C. 154(b) by 170 days.

(21) Appl. No.: 13/232,835

(22) Filed: Sep. 14, 2011

(65) Prior Publication Data

US 2012/0070039 A1   Mar. 22, 2012

(30) Foreign Application Priority Data

Sep. 16, 2010  (JP) .................................. 2010-207807

(51) Int. Cl.
*G06K 9/00* (2006.01)
(52) U.S. Cl.
USPC .......................................................... 382/128
(58) Field of Classification Search
None
See application file for complete search history.

(56) References Cited

U.S. PATENT DOCUMENTS

2001/0055462 A1 * 12/2001 Seibel .......................... 385/147
2010/0303334 A1 * 12/2010 Kitamura et al. ............. 382/141

FOREIGN PATENT DOCUMENTS

JP              11-110532         4/1999

* cited by examiner

*Primary Examiner* — Claire X Wang
(74) *Attorney, Agent, or Firm* — Bingham McCutchen LLP

(57) ABSTRACT

A surface analyzer with which users only need to perform simple operations to quantitatively compare different physical quantities, such as the altitude and phase, in a region of interest on a sample is provided. A three-dimensional color image created by mapping color information corresponding to the phase onto a three-dimensional image created from two-dimensional distribution data of a sample's altitude is displayed in an analysis result display screen. A section image is superposed on the three-dimensional color image. The one-dimensional area at which the section image intersects the sample is defined as the region of interest. The altitude and phase along this region of interest are graphically shown on the graph display area. Various characteristic values at the position of these cursors, such as the altitude and phase values or the difference in these values between two cursors, are displayed in a characteristic value table.

6 Claims, 4 Drawing Sheets

2D ALTITUDE IMAGE

2D PHASE IMAGE

SURFACE ANALYZER

TECHNICAL FIELD

The present invention relates to a surface analyzer capable of acquiring two-dimensional distribution data of different kinds of physical quantities on a predetermined area of a sample, such as a scanning probe microscope, laser microscope or electron probe micro analyzer. More specifically, it relates to a display processor for graphically displaying a result obtained in such a surface analyzer.

BACKGROUND ART

A scanning probe microscope (SPM), which is a typical surface analyzer, is a device for scanning the surface of a sample with a micro-sized probe and detecting a force resulting from the interaction between the surface and the probe. This device is capable of collecting, on the same area of a sample, not only information on the altitude (surface height or surface shape) but also two-dimensional distribution data of various kinds of physical quantities, such as phase, electric current, viscoelasticity, magnetic force, surface potential or electrostatic force. In normal conventionally used SPMs, two-dimensional distribution data of the physical quantities measured on a predetermined area of a sample are processed into a two or three-dimensional image including additional information, such as color information, and displayed on the display screen of a monitor.

In SPMs, a kind of information that cannot be obtained from a distribution image of a certain kind of physical quantity may possibly be derived from a distribution image of another kind of physical quantity. Therefore, observers often desire to simultaneously refer to image information of two or more kinds of physical quantities, such as an altitude image and a phase image or a surface potential image and an electric current image. To satisfy such a demand, in an SPM described in Patent Document 1, a three-dimensional image created from a two-dimensional distribution data of one kind of physical quantity is displayed, and color information showing a two-dimensional distribution of another kind of physical quantity is mapped onto the three-dimensional image so that the correspondence relationship between the distributions of the two different physical quantities can be easily recognized on that image.

The display method described in Patent Document 1 enables users to roughly grasp the relationship of the two-dimensional distributions of different kinds of physical quantities within a predetermined measurement area on a sample. However, with this method, it is difficult to make detailed, quantitative determination about the relationship between the aforementioned physical quantities within a predetermined area of the sample surface. It is also difficult to accurately compare a plurality of characteristic values at a specific position on the sample. Naturally, even if a conventional SPM is used, it is possible to extract necessary characteristic values from the collected two-dimensional data of the physical quantities concerned and perform the aforementioned quantitative determination or comparison. However, such a task is complex as well as time-consuming.

BACKGROUND ART DOCUMENT

Patent Document

Patent Document 1: JP-A 11-110532

DISCLOSURE OF THE INVENTION

Problem to be Solved by the Invention

The present invention has been developed to solve the previously described problem. In a surface analyzer in which two-dimensional distribution data of a plurality of physical quantities on the same area can be displayed in the form of a three-dimensional image, the present invention is primarily aimed at providing a surface analyzer in which an observer can easily specify a portion of interest and in which each of the physical quantities measured in the specified portion can be shown in a quantitative and easy-to-understand form.

Means for Solving the Problems

The present invention aimed at solving the aforementioned problem is a surface analyzer for collecting two-dimensional distribution data of a plurality of different kinds of physical quantities on a same target area of a sample, for creating a display image based on the collected data, and for showing the display image on a display device, including:

a) a first display processor for creating a three-dimensional image on the target area based on two-dimensional distribution data of a first physical quantity among the plurality of different kinds of physical quantities, for creating a three-dimensional color image by superposing, on the aforementioned three-dimensional image, a color distribution created on a basis of two-dimensional distribution data of a second physical quantity, and for displaying the three-dimensional color image in a first display area of the display device;

b) a section image creator for creating, in response to an operation of a user on an operation unit, a section image intersecting a surface of the sample, at a position on the three-dimensional color image displayed on the display device, and for superposing the section image on the three-dimensional color image; and c) a second display processor for defining, as a region of interest, a one-dimensional area at which the section image intersects the surface of the sample, for creating a graph showing distributions of or changes in values of the first and second physical quantities along the region of interest using the two-dimensional data of the first and second physical quantities, and for displaying the graph in a second display area separated from the first display area of the display device.

For example, when the surface analyzer according to the present invention is constructed as an SPM, the "plurality of different kinds of physical quantities" are the altitude, phase, electric current, viscoelasticity, magnetic force, surface potential, electrostatic force, piezoelectric property, nonlinear dielectric constant, complex transmittance, and so on.

In the surface analyzer according to the present invention, the first and second display processors as well as the section image creator are typically realized by executing a dedicated controlling and processing software program installed on a personal computer included in a system of the surface analyzer.

In the surface analyzer according to the present invention, the graph displayed by the second display processor may be a graph with an abscissa axis indicating the position in the region of interest specified as a one-dimensional area or linear area and a coordinate axis indicating the value of the first or second physical quantity. When the first or second physical quantity is the sample's altitude, the curve drawn on the graph shows the surface shape at a cross-section of the sample cut at the section. When the first or second physical quantity is the value of a physical property, such as the phase, the curve drawn on the graph shows the distribution of the value of that physical property on the surface at a cross-section of the sample cut at the section.

In the surface analyzer according to the present invention, there is no specific limitation on the section image creator as to what kind of operation should be performed using the operation unit and what kind of section image should be created. In one mode of the present invention, when two points at arbitrary positions above the sample on the three-dimensional color image are specified through the operation unit, the section image creator creates a plane or curved section image lying on the two vertical lines each connecting aforementioned two points and the foots of the two points on the sample reference plane and a straight or curved line connecting the two points. The "sample reference plane" is a plane serving as the zero basis for determining the sample's altitude. This plane is normally parallel to the flat top of a sample stage on which the sample is placed.

In the aforementioned mode, users only need to specify two points on a three-dimensional color image to determine a section image and thereby define a region of interest. The user operation to be performed for setting a one-dimensional region of interest is extremely simple. When specifying two points on the three-dimensional color image, users can visually and intuitively recognize where on the sample the region of interest will be set for the two points and what length the region of interest will have. Therefore, when it is necessary to observe physical properties of a desired portion on the sample, users can easily specify a region of interest that properly covers that portion. The section image to be superposed on the three-dimensional color image is typically a flat plane, although it may be a curved surface. That is to say, when two points are specified on the three-dimensional color image, the line that is drawn to connect the two points may be a straight line or curved line, such as an arched line.

In one preferable mode of the present invention, the surface analyzer further includes:

d) a specific position selector for selecting, according to an operation of a user on the operation unit, a position within the region of interest on the graph displayed in the second display area of the display device; and e) a numerical information presenter for computing, from the two-dimensional distribution data of the first and second physical quantities, the values of the first and second physical quantities at the specific position on the region of interest selected by the specific position selector, and for displaying the computed values in the second display area or in a third display area separated from both the first and second display areas.

In general, two-dimensional distribution data of a certain physical quantity collected by an SPM or similar surface analyzer are obtained for each of the micro-sized portions discretely set on the sample. (Naturally, even though the micro-sized portions are discretely set, their interval is extremely small.) Therefore, when a certain position within the region of interest is selected as the specific position through the specific position selector, it is possible that there is no data which exactly corresponds to that specific position.

In such a case, a calculated data for the specific position can be obtained, for example, by interpolation using a plurality of data obtained in the vicinity of the specific position along the region of interest.

In a further preferable mode of the present invention, the specific position selector is capable of selecting a plurality of specific positions within the region of interest in response to an operation of a user on the operation unit, and the numerical information presenter displays, in the third display area, a table showing numerical information of the first and second physical quantities measured at each of the plurality of specific positions. With this surface analyzer, users can more easily know the characteristic values of physical quantities at a plurality of specific positions within the region of interest and more accurately compare these values.

Effect of the Invention

With the surface analyzer according to the present invention, while roughly grasping the relationship of the two-dimensional distributions of a plurality of physical quantities on the same area of the sample, users can easily specify a region of interest on a sample and accurately know the values of each of the physical quantities within the specified portion of the sample. Thus, users can quantitatively grasp the relationships between the plurality of physical quantities within the region of interest without performing any cumbersome operation or task. When the device is constructed to numerically display of the plurality of physical quantities measured at a specific position within the region of interest, users can accurately compare different properties by simple operations. For example, in the case of the SPM, a comparison can be made between the sample's altitude and phase or between the sample's altitude and surface potential. Thus, an analysis and/or evaluation of the physical properties of the sample surface can be efficiently performed.

BRIEF DESCRIPTION OF THE DRAWINGS

"The file of this patent contains at least one drawing executed in color. Copies of this patent with color drawings will be provided by the Office upon request and payment of the necessary fee".

BEST MODE FOR CARRYING OUT THE INVENTION

A scanning probe microscope (SPM) as one embodiment of the surface analyzer according to the present invention is hereinafter described with reference to the attached drawings.

Figure 1:
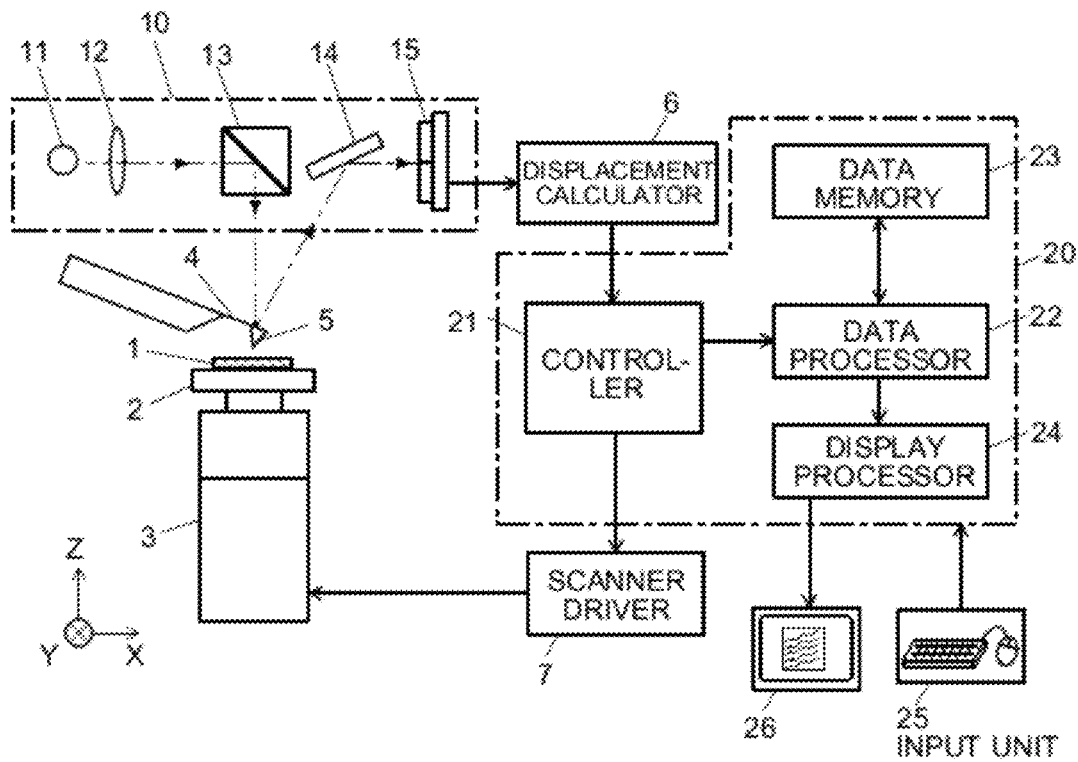
FIG. 1 is a configuration diagram showing the main components of an SPM as one embodiment of the present invention.

FIG. 1 is a configuration diagram showing the main components of the SPM in accordance with the present embodiment.

A sample 1 to be observed is placed on a sample stage 2 mounted on the upper end of a substantially cylindrical scanner 3. The scanner 3 has a plurality of piezoelectric elements and is capable of moving the sample 1 in the X and Y directions as well as finely adjusting its position in the Z direction in accordance with voltages applied from a scanner driver 7. A cantilever 4 having a probe at its tip is located above the sample 1. The cantilever 4 is driven to oscillate by an exciter including a piezoelectric element (not shown). Located above the cantilever 4 is a displacement detection unit 10 for detecting the displacement of the cantilever 4 in the Z direction. The displacement detection unit 10 includes a laser source 11, lens 12, beam splitter 13, mirror 14, photodetector 15 and other elements. In this displacement detection unit 10, a laser beam emitted from the laser source 11 and converged by the lens 12 is reflected by the beam splitter 13, to be cast onto the tip of the cantilever 4 and thereby reflected. The reflected light is received by the mirror 14 and redirected to the photodetector 15, which has a light-receiving plane divided into a plurality of sections arrayed in the displacement direction of the cantilever 4 (i.e. the Z direction).

For example, in a DFM (Dynamic Force Mode) observation, the cantilever 4 is oscillated in the Z direction at a frequency f near its resonance point. In this state, when an attractive or repulsive force due to an interatomic force or other factor acts between the probe 5 and the surface of the sample 1, the oscillation amplitude of the cantilever 4 changes. A displacement of the cantilever 4 in the Z direction causes a change in the proportion of the amounts of light falling onto the plural sections of the light-receiving plane of the photodetector 15. A displacement calculator 6 calculates the amount of displacement of the cantilever 4 by processing the detection signals corresponding to the amounts of light, and sends the obtained value to the controller 21.

The controller 21 calculates a voltage value for slightly changing the position of the scanner 3 in the Z direction via the scanner driver 7 so as to cancel the displacement of the cantilever 4, i.e. so as to maintain a constant distance between the probe 5 and the surface of the sample 1. The calculated voltage is sent to the scanner driver 7, whereby the position of the scanner 3 in the Z direction is finely adjusted. The controller 21 also calculates voltage values for the X and Y directions so as to move the sample 1 relative to the probe 5 in the X-Y plane according to a predetermined scan pattern, thereby finely adjusting the position of the scanner 3 in the X and Y directions, via the scanner driver 7. A signal which reflects the amount of feedback in the Z direction (scanner voltage) is sent from the controller 21 to a data processor 22, which processes this signal at each point (X,Y) to calculate a data corresponding to the altitude or another physical quantity of the sample 1. Based on this data, a display processor 24 creates a two-dimensional image or the like and displays it on the screen of a display unit 26. The obtained data is stored in the data memory 23.

The SPM in the present embodiment is capable of using various kinds of measurement modes to measure not only the altitude (i.e. concave-convex shape) of the sample 1 but also simultaneously measure another physical quantity (mechanical or electromagnetic property), such as the phase, electric current, magnetic force, surface potential or dielectric constant. These additional data are also stored in the data memory 23. In many cases, the controller 21, data processor 22, data memory 23, display processor 24 and other components are embodied by a personal computer 20 to which an input unit 25 including a keyboard and a pointing device (e.g. mouse) as well as a display unit 26 consisting of a monitor are connected. The previously described data-collecting operation, and a display process (to be described later), can be carried out by running a dedicated controlling and processing software program which is previously installed in the computer 20.

One example of the characteristic image-displaying process performed by the display processor in the SPM of the present embodiment is hereinafter described with reference to FIGS. 2-6. In the following description, it is assumed that a scan measurement using the probe 5 for a substantially rectangular area on a sample 1 has been performed in the previously described manner, whereby a set of data, which includes two-dimensional distribution data of the sample's altitude and two-dimensional distribution data of the phase for the aforementioned area, has been obtained and stored in the data memory 23.

Figure 5:
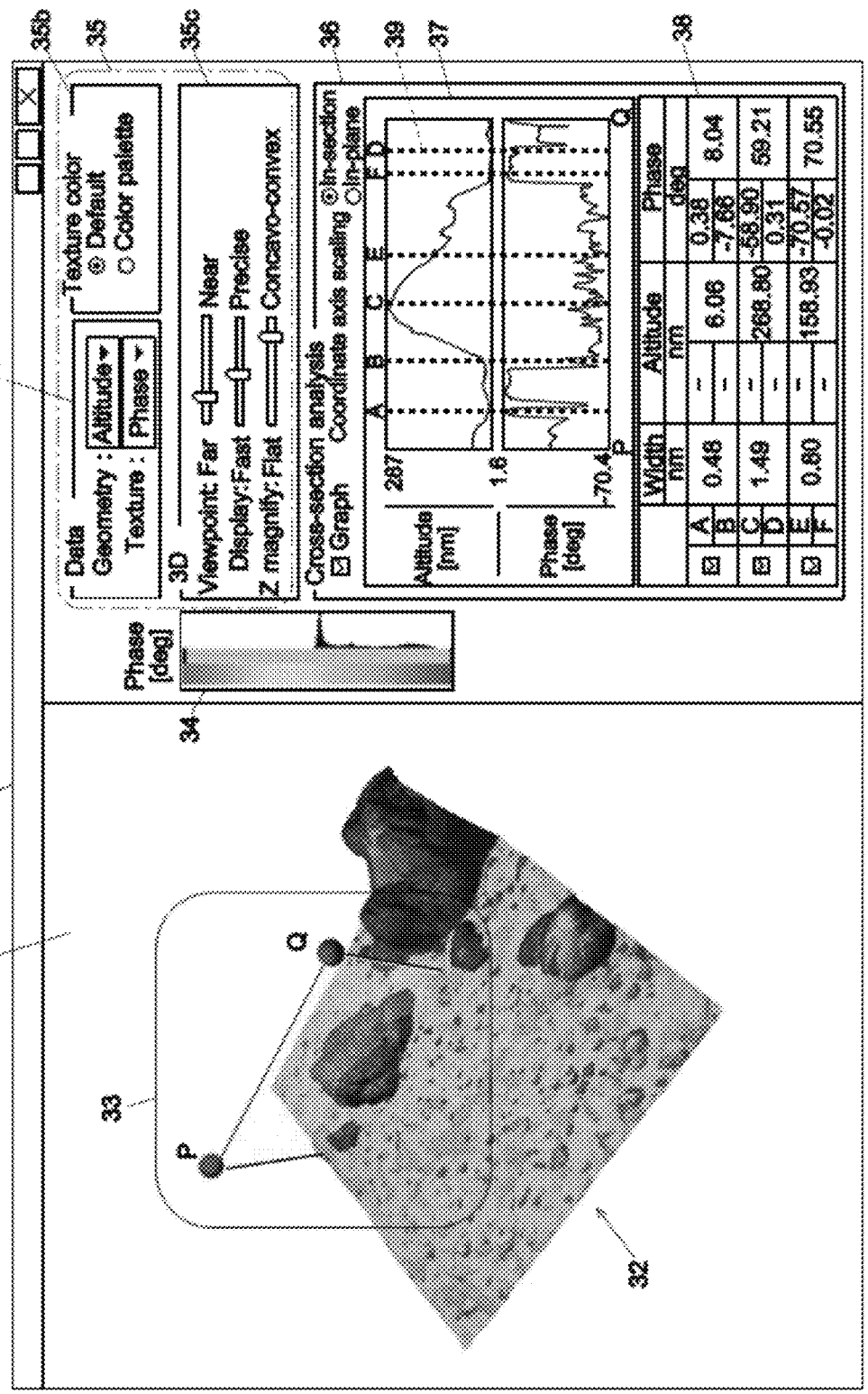
FIG. 5 shows one example of an analysis result display screen characteristic of the SPM of the present embodiment.

When an observer performs a predetermined operation on the input unit 25, the display processor 24 creates an analysis result display screen 30 as shown in FIG. 5 on the screen of the display unit 26. The analysis result display screen 30 includes a three-dimensional image display area 31, display setting area 35, cross-sectional analysis result display area 36 and so on.

In the three-dimensional image display area 31, as described later, a three-dimensional color image 32 showing the distribution of two physical quantities (the sample's altitude and phase in the present example) within a predetermined area is displayed. A color scale 34 for the three-dimensional color image 32 is displayed to the right of the three-dimensional display area 31. The display setting area 35 includes a data setting panel 35a for selecting the kinds of physical quantities to be reflected in the three-dimensional color image 32, a texture color setting panel 35b for selecting the type of color display of the texture which is set in the data setting region 35a, and a three-dimensional display setting panel 35c for controlling the viewing mode of the three-dimensional color image 32. Located in the upper part of the cross-sectional analysis result display area 36 is a graph display area 37 for displaying a quantitative graph showing the distributions of physical quantities (the sample's altitude and phase in the present example) along a one-dimensional region of interest, which is specified in a manner described later. A characteristic value table 38 for collectively showing the values of the physical quantities at specific positions within the region of interest is provided below the graph display area 37.

On the data setting panel 35a, the observer selects physical quantities corresponding to the "geometry" and "texture." The "geometry" is the surface shape in the three-dimensional color image 32, while the "texture" is color information mapped onto the three-dimensional color image 32. In the present example, the sample's altitude and phase are selected as the "geometry" and "texture", respectively. Any physical quantities obtained by the measurement can be selected as the "geometry" or "texture."

In response to the selection of the "geometry" and "texture" as well as other various settings, the display processor 24 reads the corresponding two-dimensional distribution data from the data memory 23, creates a three-dimensional color image 32 from the read data, and displays the created image on the three-dimensional image display area 31. For example, FIGS. 2A and 2B respectively show a two-dimensional altitude image and a two-dimensional phase image created from the two-dimensional distribution data of the altitude and phase acquired from the same area on a sample. The two-dimensional altitude image shown in FIG. 2A can be extended to a three-dimensional image as shown in FIG. 3.

Such a three-dimensional image helps observers to intuitively recognize the shape of the sample surface.

Figure 2A:
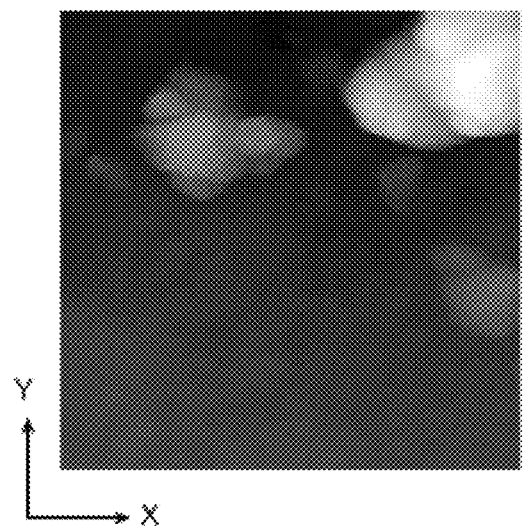
FIGS. 2A and 2B show one example of (A) a two-dimensional altitude image and (B) a phase image created from data obtained with an SPM.
Figure 2B:
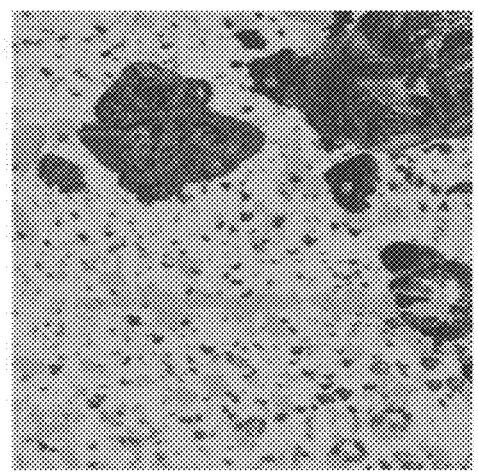
Figure 3:
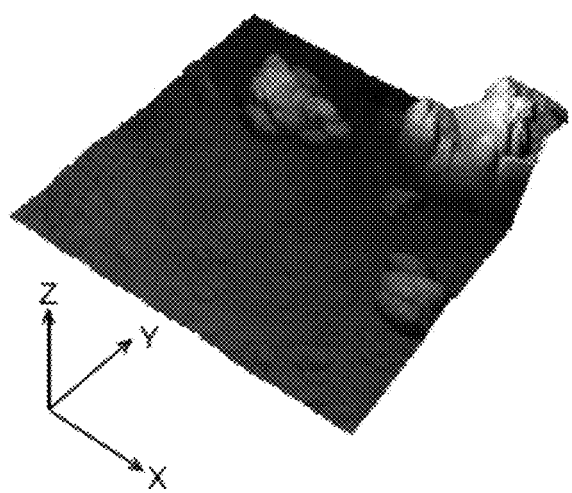
FIG. 3 shows one example of the three-dimensional altitude image created from data obtained with an SPM.
Figure 4:
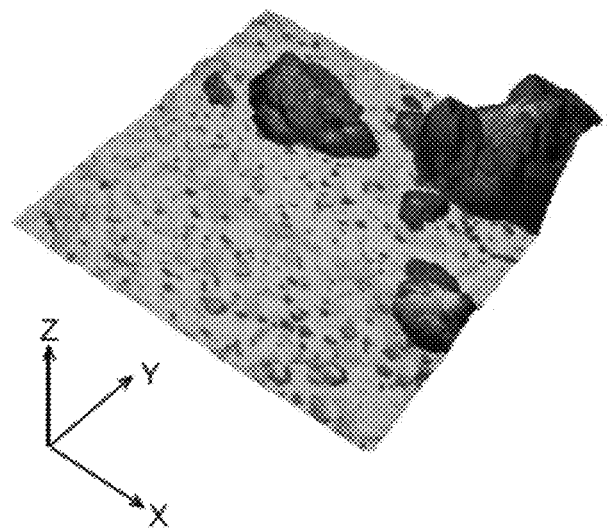
FIG. 4 shows one example of the three-dimensional color image representing the altitude distribution and phase distribution, created by mapping two-dimensional phase color information onto the three-dimensional altitude image shown in FIG. 3.

As shown in FIG. 2B, the phase is represented by the color information on the two-dimensional phase image. This color information corresponding to the phase shown in FIG. 2B can be mapped onto the three-dimensional altitude image shown in FIG. 3 to obtain a three-dimensional color image as shown in FIG. 4. In this three-dimensional color image, the surface shape represents the sample's altitude while the color represents the phase. Thus, two physical quantities (i.e. the sample's altitude and the phase) are simultaneously reflected in one image. Based on the two-dimensional data read from the data memory 23, the display processor 24 performs the previously described process to create a three-dimensional color image as shown in FIG. 4 and displays the created image in the three-dimensional image display area 31. From the displayed three-dimensional color image, observers can roughly grasp the relationship between the surface shape and the phase of the surface within a predetermined area on the sample.

As shown in FIG. 5, the display processor 24 displays two spherical pointers P and Q within the three-dimensional image display area 31. The position of each pointer can be changed by a user operation using the input unit 25. When the observer moves each of the two pointers P and Q to an arbitrary position by operating a mouse or similar pointing device, the display processor 24 creates a section image 33 for the latest position of the pointers P and Q, and displays it on the three-dimensional color image 32. One example of the method for creating the section image 33 is hereinafter described with reference to FIG. 6.

Figure 6:
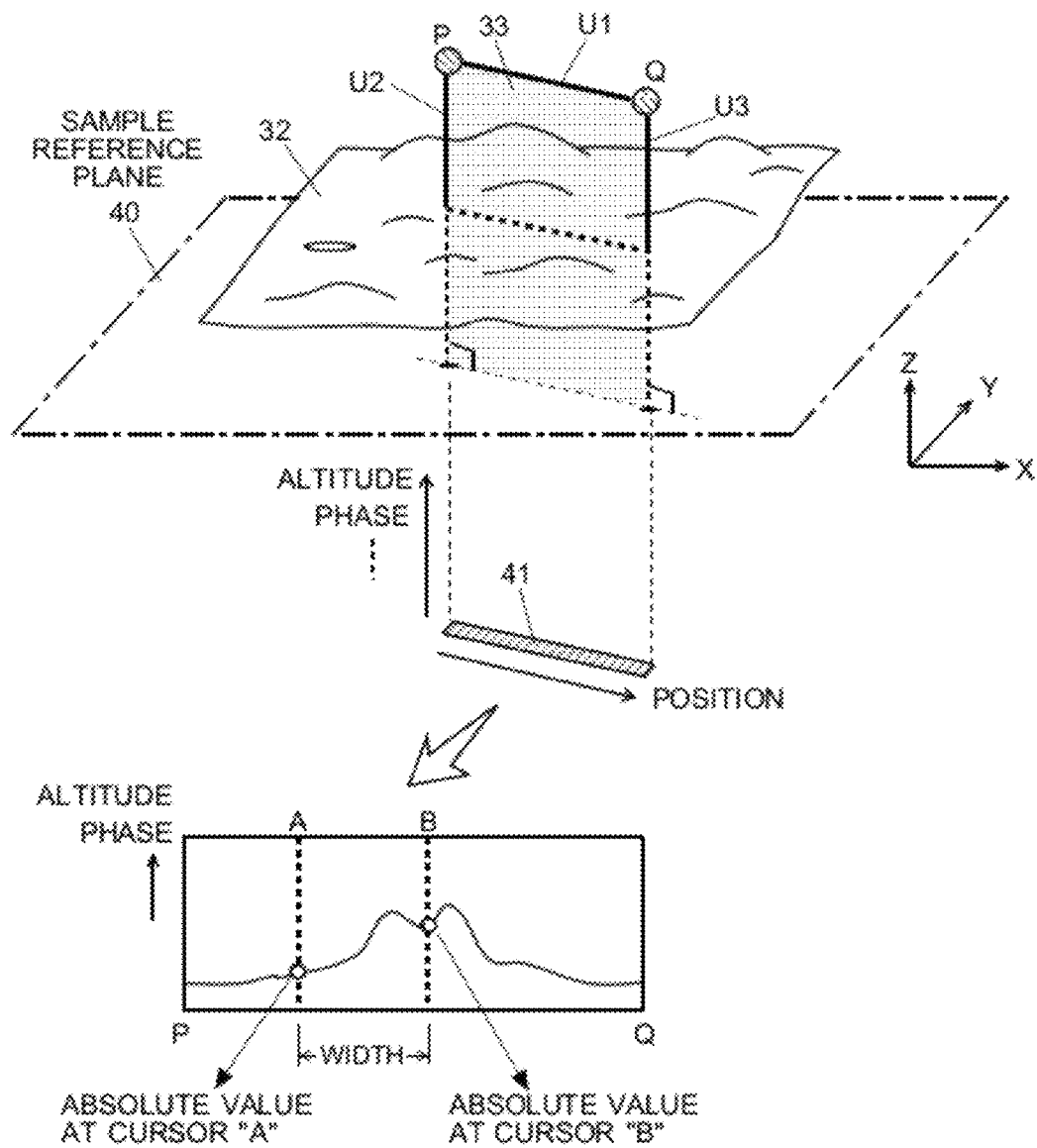
FIG. 6 is an explanatory diagram showing illustrating a display process characteristic of the SPM of the present embodiment.

As shown in FIG. 6, SPM measurements use a sample reference plane 40 which is virtually set for quantifying the altitude of the sample 1. For example, this sample reference plane 40 is a plane parallel to the flat top of the sample stage 2. When two pointers P and Q are set at positions above a sample represented on the three-dimensional color image 32, it is possible to draw three lines, i.e. the line U1 connecting the two pointers P and Q, the line U2 extending from the pointer P and perpendicularly intersecting the sample reference plane 40, and the line U3 extending from the pointer Q and perpendicularly intersecting the sample reference plane 40. A section is created by using the lines U1, U2 and U3 as three sides and appropriately setting another (fourth) side below the sample surface. This section, which is visualized as the section image 33, intersects the sample at a one-dimensional area. A region of interest 41 is set by projecting the aforementioned one-dimensional area onto the sample reference plane 40 or another plane parallel to that plane 40. When the observer performs an operation for moving the points P and/or Q in the spreading direction of the sample surface (i.e. in the X and Y directions), the section image 33 also moves according to the operation, which naturally results in a movement of the region of interest 41.

Furthermore, the display processor 24 obtains positional information in the X-Y plane for the region of interest determined by the positions of the two pointers P and Q in the previously described manner, and extracts the altitude data and phase data corresponding to the position information from the respective two-dimensional distribution data. As shown in FIG. 6, since the region of interest 41 is a one-dimensional area, the altitude data and phase data are extracted for each position along this one-dimensional area. Subsequently, the display processor 24 creates two graphs for the altitude and phase, respectively, with the abscissa axis indicating the position within the region of interest and the coordinate axis indicating the altitude or phase, and displays the two graphs one above the other in the graph display area 37, as shown in FIG. 5. When an operation for moving the two pointers P and Q is performed by the observer, the region of interest moves on the sample, which changes the position information of the region of interest. Accordingly, the curves in the graphs displayed in the graph display area 37 also change their shapes. Every time the pointers P and Q are moved by the observer's operation, the displayed graphs are renewed to show the altitude and phase distributions within the one-dimensional region of interest determined by the positions of the pointers P and Q at that point in time.

When the observer slowly moves the two pointers P and Q, the altitude and phase distributions displayed in the graph display area 37 continuously change with the motion of the pointers at a rate depending on the processing speed of the personal computer 20. In this manner, the observer can quantitatively grasp the altitude and phase distributions within a desired one-dimensional area on the sample. Since the two graphs showing the altitude and phase distributions in the graph display area 37 are vertically arranged and share the same abscissa scale, it is easy to quantitatively grasp the relationship between the altitude and phase over the entire region of interest or the relationship between the altitude and phase at any position within that region of interest.

Furthermore, the display processor 24 superposes six cursors A, B, C, D, E and F on the two graphs shown in the graph display area 37, as indicated by the vertical lines. (Although these lines in FIGS. 5 and 6 are drawn as broken lines, they are actually solid lines in a different color.) The observer can freely move each cursor along the abscissa axis by operating a mouse or similar pointing device. These cursors include three pairs: A-B, C-D and E-F. For each of these cursors, the display processor 24 calculates characteristic values and displays them in the characteristic value table 38. For example, the characteristic values include: the width (distance) of the section between each pair of cursors, the altitude difference in that section, the phase difference in that section, the absolute value of the altitude at the position of each cursor, and the property value of the phase at the position of each cursor. It should be noted that no absolute value of the altitude at the positions of the cursors A-F is computed in the example of FIG. 5. When the observer performs a pointing-device operation to move any of the cursors A-F to an appropriate position, the values in the characteristic value table 38 change in response to the moving operation. In this manner, different characteristic values for the same position in the region of interest can be accurately compared on a numerical basis.

In actual measurements, the acquisition of two-dimensional distribution data within a predetermined area on a sample is not continuously performed in the X and Y directions but at predetermined intervals of space, i.e. in a discrete manner. Therefore, it is possible that there is actually no data corresponding to the position of the cursor A-F. In such a case, the characteristic value to be shown in the characteristic value table 38 can be computationally obtained, for example, by interpolation using data obtained at positions located near the specified position along the region of interest.

As described thus far, with the SPM of the present embodiment, while watching a three-dimensional color image which reflects the two-dimensional distributions of a plurality of physical quantities, the observer can set a desired one-dimensional region of interest by simple operations and quantitatively check the physical quantities over the entire region of interest or at a specific position within the region of interest.

Figure 7:
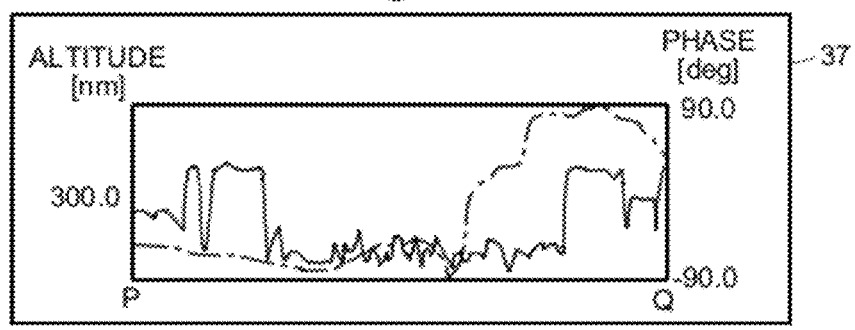
FIG. 7 shows a variation of the method of displaying a graph in the graph display area in the analysis result display screen shown in FIG. 5.

In the SAM of the previous embodiment, the graphs illustrating the distributions of different physical quantities (altitude and phase) along a region of interest defined by the points P and Q selected by an observer are independently displayed in the graph display area 37 of the analysis result display screen 30. Alternatively, it is possible to show the distributions of different physical quantities in a superposed form on the same graph. As one example, FIG. 7 shows a graph in which both the altitude distribution and the phase distribution are displayed in a superposed form. Though not explicitly shown in FIG. 7, the curve shown by the chain line (altitude distribution) and the curve shown by the solid line (phase distribution) are actually drawn in different colors so that observers can easily distinguish the two curves.

Although the previous embodiment selected an SPM as an example, it is obvious that the present invention can be generally applied to any types of surface analyzers capable of measuring two-dimensional distributions of a plurality of different physical quantities for a specific area on the surface of a sample. Other examples of such surface analyzers include laser microscopes and electron probe micro analyzers.

It should be noted that the previous embodiment is a mere example of the present invention, and any change, modification or addition appropriately made within the spirit of the present invention will evidently fall within the scope of claims of the present patent application.

EXPLANATION OF NUMERALS

1 ... Sample
2 ... Sample Stage
3 ... Scanner
4 ... Cantilever
5 ... Probe
6 ... Displacement Calculator
7 ... Scanner Driver
10 ... Displacement Detector
11 ... Laser Source
12 ... Lens
13 ... Beam Splitter
14 ... Mirror
15 ... Photodetector
20 ... Personal Computer
21 ... Controller
22 ... Data Processor
23 ... Data Memory
24 ... Display Processor
25 ... Input Unit
26 ... Display Unit

The invention claimed is:

1. A surface analyzer for collecting two-dimensional distribution data of a plurality of different kinds of physical quantities on a same target area of a sample, for creating a display image based on the collected data, and for showing the display image on a display device, comprising:
   a) a first display processor for creating a three-dimensional image on the target area based on two-dimensional distribution data of a first physical quantity among the plurality of different kinds of physical quantities, for creating a three-dimensional color image by superposing, on the aforementioned three-dimensional image, a color distribution created on a basis of two-dimensional distribution data of a second physical quantity, and for displaying the three-dimensional color image in a first display area of the display device;
   b) a section image creator for creating, in response to an operation of a user on an operation unit, a section image intersecting a surface of the sample, at a position on the three-dimensional color image, and for superposing the section image on the three-dimensional color image; and
   c) a second display processor for defining, as a region of interest, a one-dimensional area at which the section image intersects the surface of the sample, for creating a graph showing distributions of or changes in values of the first and second physical quantities along the region of interest using the two-dimensional data of the first and second physical quantities, and for displaying the graph in a second display area separated from the first display area of the display device.

2. The surface analyzer according to claim 1, wherein:
when two points at arbitrary positions above the sample in the three-dimensional color image are specified through the operation unit, the section image creator creates a section image lying on two vertical lines each connecting the two points and two foots of the two points on a sample reference plane and a line connecting the two points.

3. The surface analyzer according to claim 1, further comprising:
   d) a specific position selector for selecting, according to an operation of a user on the operation unit, a position within the region of interest on the graph displayed in the second display area of the display device; and
   e) a numerical information presenter for computing, from the two-dimensional distribution data of the first and second physical quantities, the values of the first and second physical quantities at the specific position on the region of interest selected by the specific position selector, and for displaying the computed values in the second display area or in a third display area separated from both the first and second display areas.

4. The surface analyzer according to claim 2, further comprising:
   d) a specific position selector for selecting, according to an operation of a user on the operation unit, a position within the region of interest on the graph displayed in the second display area of the display device; and
   e) a numerical information presenter for computing, from the two-dimensional distribution data of the first and second physical quantities, the values of the first and second physical quantities at the specific position on the region of interest selected by the specific position selector, and for displaying the computed values in the second display area or in a third display area separated from both the first and second display areas.

5. The surface analyzer according to claim 3, wherein:
the specific position selector is capable of selecting a plurality of specific positions within the region of interest in response to an operation of a user on the operation unit, and the numerical information presenter displays, in the third display area, a table showing numerical information of the first and second physical quantities measured at each of the plurality of specific positions.

6. The surface analyzer according to claim 4, wherein:
the specific position selector is capable of selecting a plurality of specific positions within the region of interest in response to an operation of a user on the operation unit, and the numerical information presenter displays, in the third display area, a table showing numerical information of the first and second physical quantities measured at each of the plurality of specific positions.

* * * * *